(12) United States Patent
Goodell

(10) Patent No.: US 6,396,325 B2
(45) Date of Patent: May 28, 2002

(54) HIGH FREQUENCY MOSFET SWITCH

(75) Inventor: Trenor F. Goodell, Peaks Island, ME (US)

(73) Assignee: Fairchild Semiconductor Corporation, Portland, ME (US)

( * ) Notice: Subject to any disclaimer, the term of this patent is extended or adjusted under 35 U.S.C. 154(b) by 0 days.

(21) Appl. No.: 09/780,199

(22) Filed: Feb. 9, 2001

Related U.S. Application Data

(63) Continuation-in-part of application No. 09/454,709, filed on Dec. 3, 1999, now abandoned.

(51) Int. Cl.[7] .............................................. H03L 5/00
(52) U.S. Cl. ....................... 327/308; 327/376; 327/377; 327/427
(58) Field of Search ................................. 327/308, 374, 327/376, 377, 382, 383, 427, 434, 435, 404, 327; 326/17

(56) References Cited

U.S. PATENT DOCUMENTS

| | | | | |
|---|---|---|---|---|
| 3,872,325 A | * | 3/1975 | Adams et al. ............... | 327/389 |
| 4,316,101 A | * | 2/1982 | Minner ........................ | 327/434 |
| 4,787,686 A | * | 11/1988 | Tajima et al. ............... | 327/308 |
| 5,072,142 A | * | 12/1991 | Tanino ........................ | 327/427 |
| 5,332,916 A | * | 7/1994 | Hirai .......................... | 257/369 |
| 5,461,265 A | * | 10/1995 | Kunihisha et al. ............ | 307/98 |
| 5,519,364 A | * | 5/1996 | Kato et al. .................. | 333/103 |
| 5,883,541 A | * | 3/1999 | Tahara et al. ............... | 327/434 |
| 5,903,178 A | * | 5/1999 | Miyatsuji et al. ........... | 327/308 |
| 5,969,560 A | * | 10/1999 | Kohama et al. ............. | 327/308 |
| 6,020,778 A | * | 2/2000 | Shigehara et al. .......... | 327/534 |
| 6,118,985 A | * | 9/2000 | Kawakyu et al. ............. | 455/78 |
| 6,236,259 B1 | * | 5/2001 | Goodell et al. ............. | 327/534 |
| 6,281,737 B1 | * | 8/2001 | Kuang et al. ................ | 327/382 |

* cited by examiner

*Primary Examiner*—Terry D. Cunningham
*Assistant Examiner*—Hai L. Nguyen
(74) *Attorney, Agent, or Firm*—Cesari and McKenna, LLP; Edwin H. Paul, Esq.

(57) ABSTRACT

A high-frequency switch circuit having an MOS pass gate or transfer transistor. The switch circuit of the invention includes a first impedance element coupled to the gate of the transfer transistor and, preferably, an alternative second impedance element coupled to the bulk of the transfer transistor. One or both of the impedance elements substantially negates the low-parasitic shunt capacitance associated with the transfer transistor that controls signal attenuation under high frequency operation. The impedance element is coupled in series with that parasitic capacitance to increase substantially the impedance of that pathway, thereby increasing substantially the passable bandwidth. The impedance element may simply be a resistor. The switch circuit is suitable for use in an array of applications, including signal propagation in computing systems, routers, and flat panel screen displays.

28 Claims, 9 Drawing Sheets

HIGH FREQUENCY MOSFET SWITCH

RELATED APPLICATIONS

The present application is a continuation-in-part of U.S. application Ser. No. 09/454,709, filed Dec. 03,1999, now abandoned. This prior application is hereby incorporated herein by reference.

BACKGROUND OF THE INVENTION

1. Field of the Invention

The present invention relates to electronic switches. In particular, the present invention relates to semiconductor switches, including those formed of one or more metal-oxide-semiconductor field effect transistors (MOSFET). More particularly, the present invention relates to semiconductor switches capable of switching at relatively high frequencies, including those frequencies above about one gigahertz.

2. Description of the Prior Art

Developments in semiconductor technology have created the capability to produce low-cost, highly reliable switches that are, effectively, implementations of mechanical relays. They have been found to be of particular use, when implemented, as single pole, single throw, type relays, but are not limited thereto. Semiconductor switches are being used more and more as replacements for the prior mechanical relays, due to the high switching speed available as well as their ability to transfer relatively high currents without failure. These switches are often referred to as transfer gates or pass transistors as they employ the characteristics of transistors—usually MOS transistors—to either permit or prevent the passage of a signal.

It is well known that switches are widely used in many fields. They are used in all variety of large- and small-scale consumer products, including, but not limited to, automobiles and home electronics. They can be and are used as analog routers, gates, and relays. They are used as digital multiplexers, routers, and gates as well.

A generic P-type MOS transistor switch is shown in FIG. 1. The switch is essentially PMOS transistor M1 having a source coupled to node A and a drain coupled to node B for the purpose of regulating signal transmission between nodes A and B. The control gate of switch M1 is enabled by way of a coupling to enable-signal-input node EN from external control circuitry. EN is commonly coupled to the gate of M1 by way of an inverter chain including one or more pairs of inverters such as inverters IV1 and IV2. Inverters IV1 and IV2 are powered by a high-potential power rail identified as Vcc and a low-potential power rail identified as GND. The bulk of the switch transistor is coupled to the high-potential power rail. In operation, a logic LOW applied at EN propagates through the inverter chain to turn on M1, thereby allowing a signal to pass between nodes A and B, whether from A to B or from B to A. A logic HIGH at EN turns M1 off, thereby blocking signal propagation between nodes A and B.

For illustration purposes in order to advance the discussion of the present invention, line resistances R1 and R2 are shown, as are parasitic capacitances C1, C2, and C3. Resistances R1 and R2 represent the impedances associated with circuitry coupled to the transistor switch circuit. That impedance may be of some expected value; for example, in certain applications, resistances R1 and R2 are generally on the order of about 50 ohms. However, it is important to note that the present invention is not limited to any specific load impedances associated with external circuitry.

Continuing the discussion regarding FIG. 1, capacitance C1 represents the impedance associated with the gate-to-source interface of the transistor structure, capacitance C2 represents the impedance associated with the drain-to-gate interface of the transistor structure, and capacitance C3 represents the impedance associated with the gate-to-bulk interface (typically a gate oxide layer) of the transistor structure. It is to be noted that an N-type MOS transistor may be employed to perform a complimentary same switching function as that provided by PMOS transistor M1, with appropriate modifications in the inverter chain and the coupling of the bulk of the transistor to GND instead of Vcc, and bearing in mind certain differences understood by those skilled in the art in regard to NMOS and PMOS transistors.

MOS transistors are desirable in that they consume very little power to operate. As fabrication techniques have advanced, the supply potentials and switching speeds at which such structures can operate effectively have improved. Nevertheless, it has been determined that most silicon MOS transistor switches configured in the manner shown in FIG. 1 have significant difficulty in propagating signals between A and B when such signals exceed transmission frequencies on the order of 400 MHz. It may appear to be possible to improve this characteristic by reducing the size of M1; however, there is an undesirable trade-off involving an increase in the on-resistance of the transistor. Apart from an overall interest in keeping transistor on resistances low, the net result when evaluating the transfer function of the structure may be little or no gain in frequency performance.

An analysis of the impedances of the switch transistor shown in FIG. 1 leads to an understanding of the propagation frequency limitation associated with that device. Specifically, as the transmission signal propagation frequency exceeds 300 MHz, for example, the impedances associated with the characteristic of the system identified simply by resistances R1 and R2, and the gate-coupled capacitances C1, C2, and C3 begin to dominate the transfer function. As a result, at such a frequency and higher, a shunt or short is established between the transistor's bulk coupled to Vcc and GND (through inverter IV2 that enables M1). The dominating impedance at such frequencies causes an unacceptable attenuation of the signal to be passed. As earlier noted, this cannot be resolved by reducing the gate size of M1 as that drives up the drain-source resistance undesirably.

For most computing applications, the frequency limitations of MOS transistor switches are of little concern. However, as the drive for increased operating bandwidth capabilities grows, such as in the video transmission field for example, there is a greater need for MOS transistor switches that can pass relatively higher frequency transmissions with minimal losses. Therefore, what is needed is a semiconductor circuit that acts as a switch for digital and analog operations. What is also needed is a semiconductor switch circuit that is operable as a transfer gate or pass gate over an array of expected supply potentials. Further, what is needed is a MOSFET-based switch circuit capable of propagating relatively high frequency signals with minimal attenuation. What is further needed is such a switch circuit that propagates high-frequency transmissions with minimal effect on the on-resistance associated with the transistor circuit.

SUMMARY OF THE INVENTION

It is an object of the present invention to provide a semiconductor circuit that acts as a switch for digital and analog operations. It is also an object of the present invention to provide a semiconductor switch that is a transfer gate or pass gate operable for a broad range of supply potentials. It is a further object of the present invention to provide a MOSFET-based switch circuit capable of propagating relatively high frequency signals with minimal attenuation. Another object of the present invention is to provide such a switch circuit that propagates high-frequency transmissions with minimal effect on the on-resistance associated with the MOSFET-based passgate structure.

These and other objectives are achieved in the present invention by increasing the impedance of the shunting pathway associated with the existing MOSFET structure used to establish the pass gate. Specifically, an impedance element, such as a resistive device, a capacitive device, or a combination thereof, is coupled between the gate of the pass gate transistor and a supply rail. The impedance element serves to decouple the pass gate transistor's gate from the supply rail that determines the gate potential. Additionally, such an impedance element may be coupled between the bulk of the pass gate transistor and the supply rail to which the bulk is coupled, again, to decouple that portion of the pass gate transistor from that particular supply rail. For a PMOS transistor, the bulk is ordinarily coupled directly to the high-potential rail, and for an NMOS transistor, the bulk is ordinarily coupled to the low-potential rail. It has been determined that for a conventional MOS transistor structure employed as the pass gate transistor, an impedance that is greater than the impedance of the system is preferable to at least double the substantially un attenuated signal frequency that may propagate through the circuit of the present invention. Of course, the particular impedance employed may be selected as a function of the particular characteristics of the pass gate, the operating frequencies of interest, and the anticipated load on the circuit, among other factors. Additionally, it is to be noted that any nonzero impedance supplement will improve the response performance of the switch.

The impedance element of the present invention is coupled in series with the parasitic capacitance pathways of the pass gate transistor so as to increase the overall impedance of those pathways. As a result, the prior shunt that those capacitance pathways established is substantially negated, particularly under those conditions where propagation of higher frequencies is of interest. In all other respects the pass gate transistor circuit of the present invention permits signal transmission as expected for conventional complementary MOS (CMOS) switch devices.

The present invention is suitable for use in a wide array of applications in which high-frequency switching is of interest. On the most fundamental level, pass gate circuits effect the propagation of individual signals from one location to another. Ganged together, they can operate to propagate vast sets of signals in order to create data transmission systems that generate outcomes of increasing complexity. On a basic level, pass gate circuits may be used to form buses and backplanes that are interconnecting devices designed to enable the propagation of signals among discrete devices. Local or internal buses provide signal paths for propagation within a discrete device, such as a microprocessor. Types of local buses included in microprocessor systems include ISA, EISA, Micro Channel, VL-bus and PC1 bus. Examples of buses to connect peripheral systems, such as printers, keyboards, and the like, include NuBus, TURBOchannel, VMEbus, MULTIBUS and STD bus. Each such type of signal transmission system can operate only as effectively as the components used to create it. Improved pass gate circuits such as that of the present invention may be employed in any such bus, as well as backplane structures used to interconnect printed circuit boards, to increase propagation rates. For video and graphics signal transmissions, including for flat screen panels in particular, interfaces such as Low Voltage Differential Signaling (LVDS), Transmission Minimized Differential Signaling (TMDS), A synchronous Transfer Mode (ATM), and Digital Visual Interface (DVI) are designed to enable such transmissions. The present invention establishes the type of transmission bandwidth required for such interface standards.

Increased propagation rates are of particular interest for the rapid transfer of dense data packets. Improved routers used to forward data packets from one location to another rely increasingly upon switch circuitry to enhance data transfer through local and wide area networks. This is particularly the case for high quality video, graphics, data, and voice transmissions passed by wire, optical and wireless connections. The routers are used to control the flow of signal traffic among devices and are dependent upon recognition of a variety of signal transmission protocols. Such protocols include, but are not limited to, IP, IPX, AppleTalk, DECnet. Improved switching circuitry such as the circuit of the present invention, facilitates and enhances the operation of such signal routers. Of course, the present invention is suitable for use in any computing system, such as personal computers, personal digital devices, telecommunications devices, and other electronic systems requiring rapid high quality signal propagation.

These and other advantages of the present invention will become apparent upon review of the following detailed description of the embodiments of the invention, the accompanying drawings, and the appended claims.

DETAILED DESCRIPTION OF THE PREFERRED EMBODIMENTS OF THE INVENTION

Figure 1:
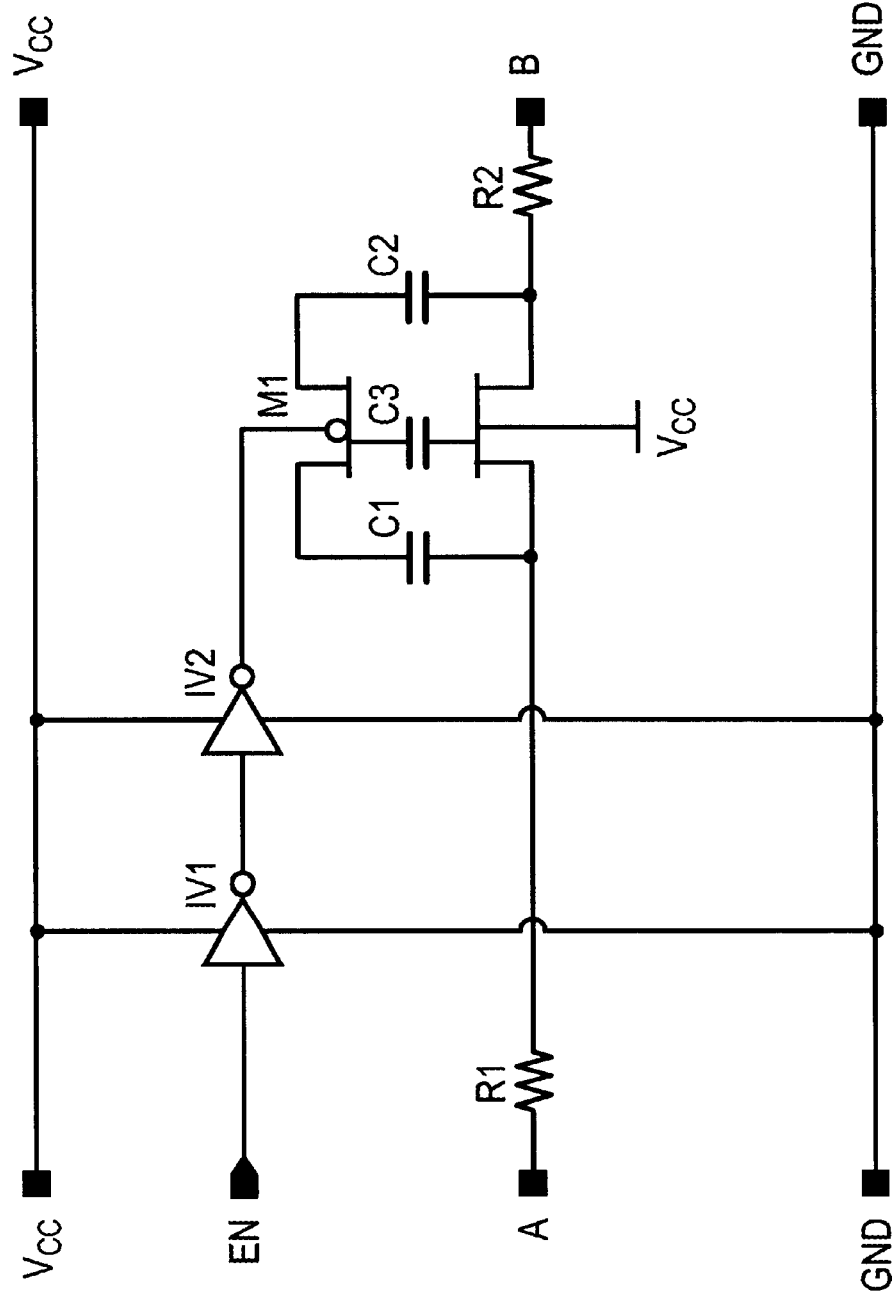
FIG. 1 is a simplified schematic diagram of a prior-art transfer gate having a single enhancement-mode PMOS transistor as the transfer device.
Figure 2:
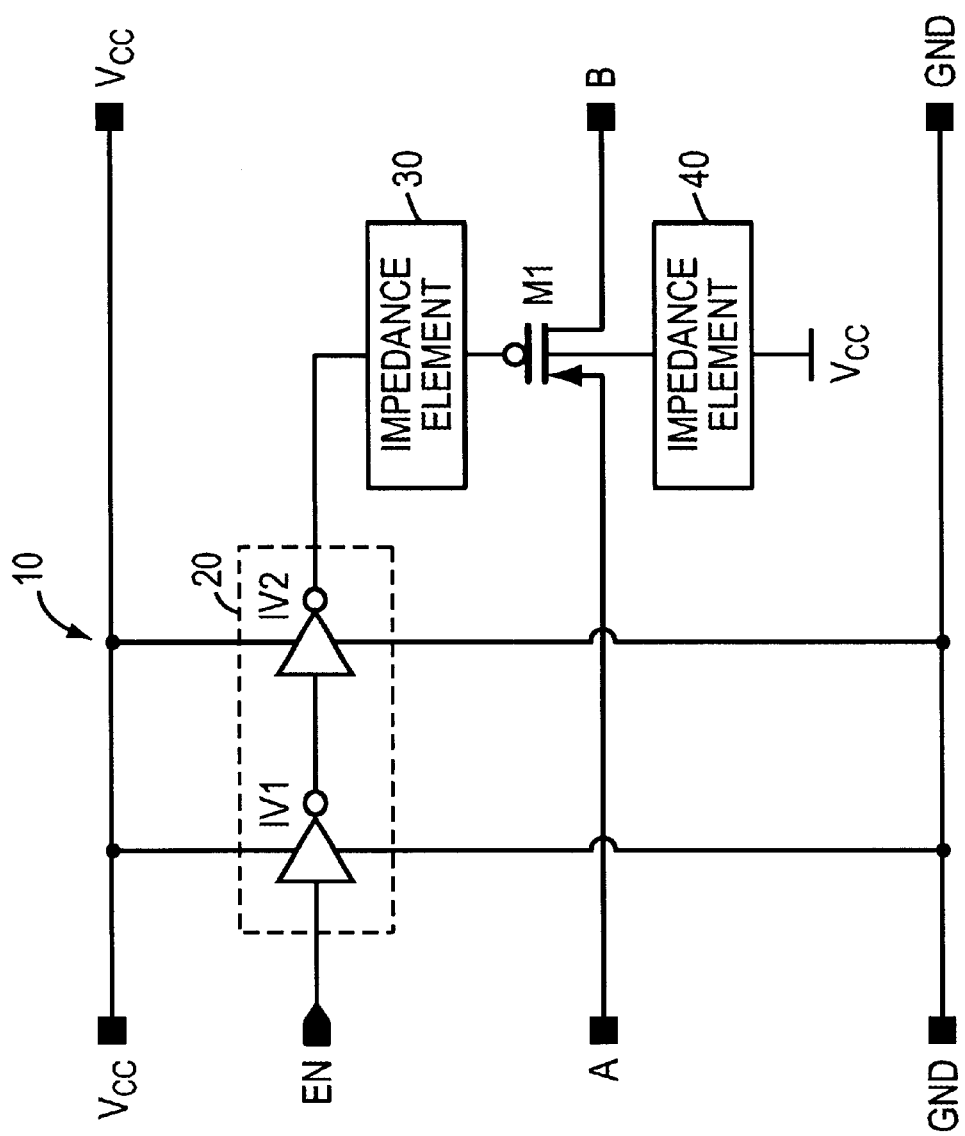
FIG. 2 is a simplified schematic block diagram of the high-frequency switch circuit of the present invention, showing a PMOS pass gate transistor coupled to a pair of impedance elements, all of which are couplable to an extended circuit.

A high-frequency switch circuit 10 of the present invention is shown in FIG. 2. The circuit 10 includes an inverter stage 20 preferably formed of inverters IV1 and IV2 and PMOS pass gate transistor M1, much as in the prior-art switch shown in FIG. 1. Of course, the inverter stage 20 may be formed of a plurality of pairs of inverters, or some alternative form of enable signal propagation mechanism. The circuit 10 also includes a first impedance element 30 and a second impedance element 40, wherein element 30 is coupled between the output of inverter stage 20 and the gate of M1 and element 40 is coupled between the bulk of M1 and high-potential power rail Vcc. An enable signal coming from a control circuit (not shown) by output enable node EN is preferably coupled to the input of the inverter stage 20 to substantially define the control of the operation of transistor M1 by its gate. Inverters IV1 and IV2 are typically powered by high-potential rail Vcc and low-potential rail GND. It is to be noted that the first impedance element 30 may be coupled to the gate of M1 in an alternative manner, provided it acts to decouple that gate from the supply rail. The same can be said in regard to the coupling of second impedance element 40.

Transistor M1 is the primary regulator of the transfer of a signal between nodes A and B. Either of node A or node B may be an input node or an output node, dependent upon the direction of the signal passing between external circuitry coupled to those two nodes. Elements 30 and 40 are designed to provide serial impedance between the gate of M1 and the output of stage 20 and the bulk of M1 and Vcc, respectively. The result is a relatively high-impedance pathway previously characterized by the parasitic capacitances of the transistor M1 that otherwise would dominate at high frequencies of 350 MHz or more.

Figure 3:
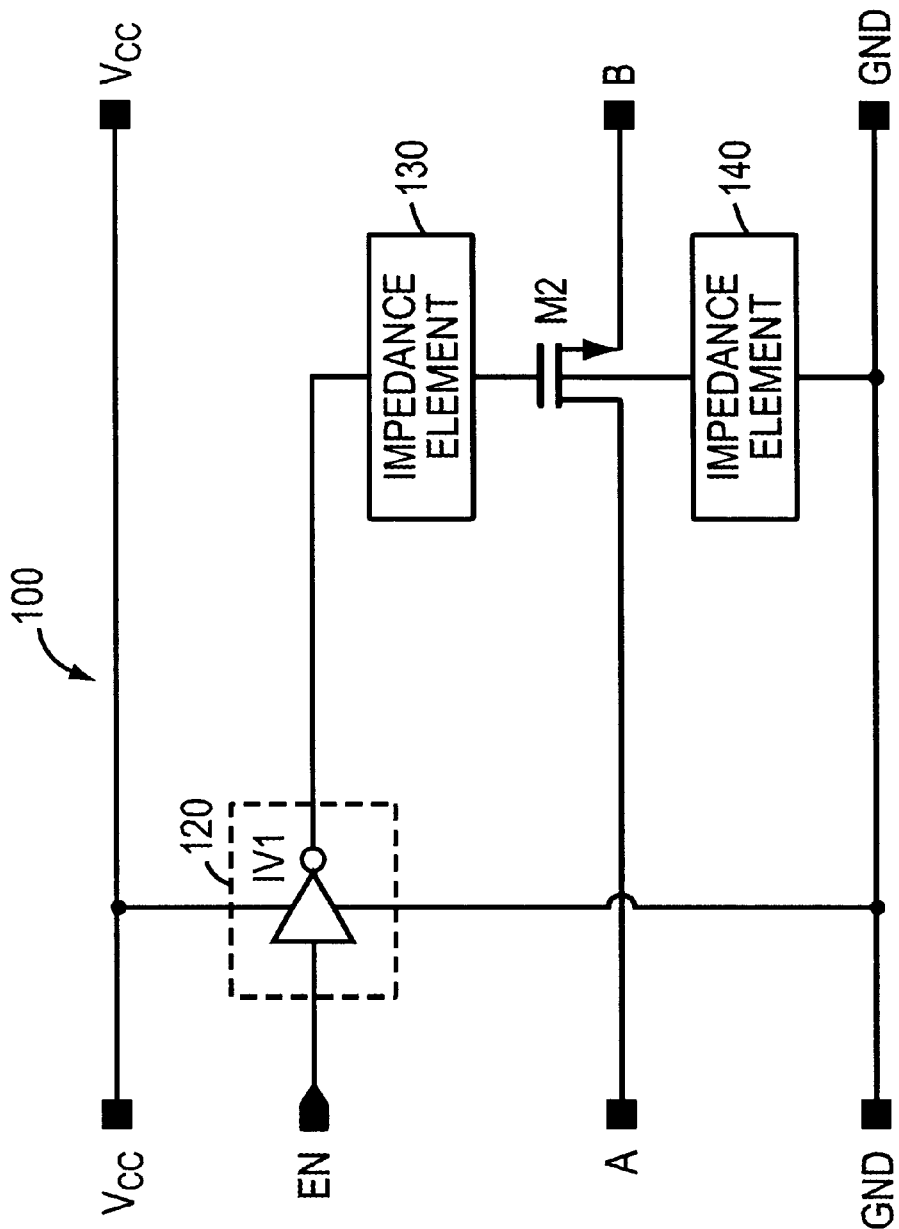
FIG. 3 is a simplified schematic block diagram of the high-frequency switch circuit of the present invention, showing an NMOS pass gate transistor coupled to a pair of impedance elements, all of which are coupleable to an extended circuit.

An equivalent high-frequency switch circuit 100 is shown in FIG. 3 for an NMOS pass gate transistor M2. The circuit 100 includes an inverter stage 120 preferably formed of inverter IV1 and NMOS pass gate transistor M2. Of course, the inverter stage 120 may be formed of a plurality of an odd number of inverters, or some alternative form of enable signal propagation mechanism. Additionally, the circuit 100 includes a first impedance element 130 and a second impedance element 140, wherein element 130 is coupled between the output of inverter stage 120 and the gate of M2 and element 140 is coupled between the bulk of M1 and GND. An enable signal coming from a control circuit (not shown) by output enable node EN is preferably coupled to the input of the inverter stage 120 to substantially define the control of the operation of transistor M2 by its gate. Vcc and GND typically power inverter IV1. Transistor M2 is the primary regulator of the transfer of a signal between nodes A and B. Either of node A or node B may be an input node or an output node, dependent upon the direction of the signal passing between external circuitry coupled to those two nodes. Elements 130 and 140 are designed to provide serial impedance between the gate of M2 and the output of stage 120 and the bulk of M2 and GND, respectively. The result is a relatively high-impedance pathway previously characterized by the parasitic capacitances of the transistor M2 that otherwise would dominate at relatively high frequencies of 350 MHz or more.

Figure 4:
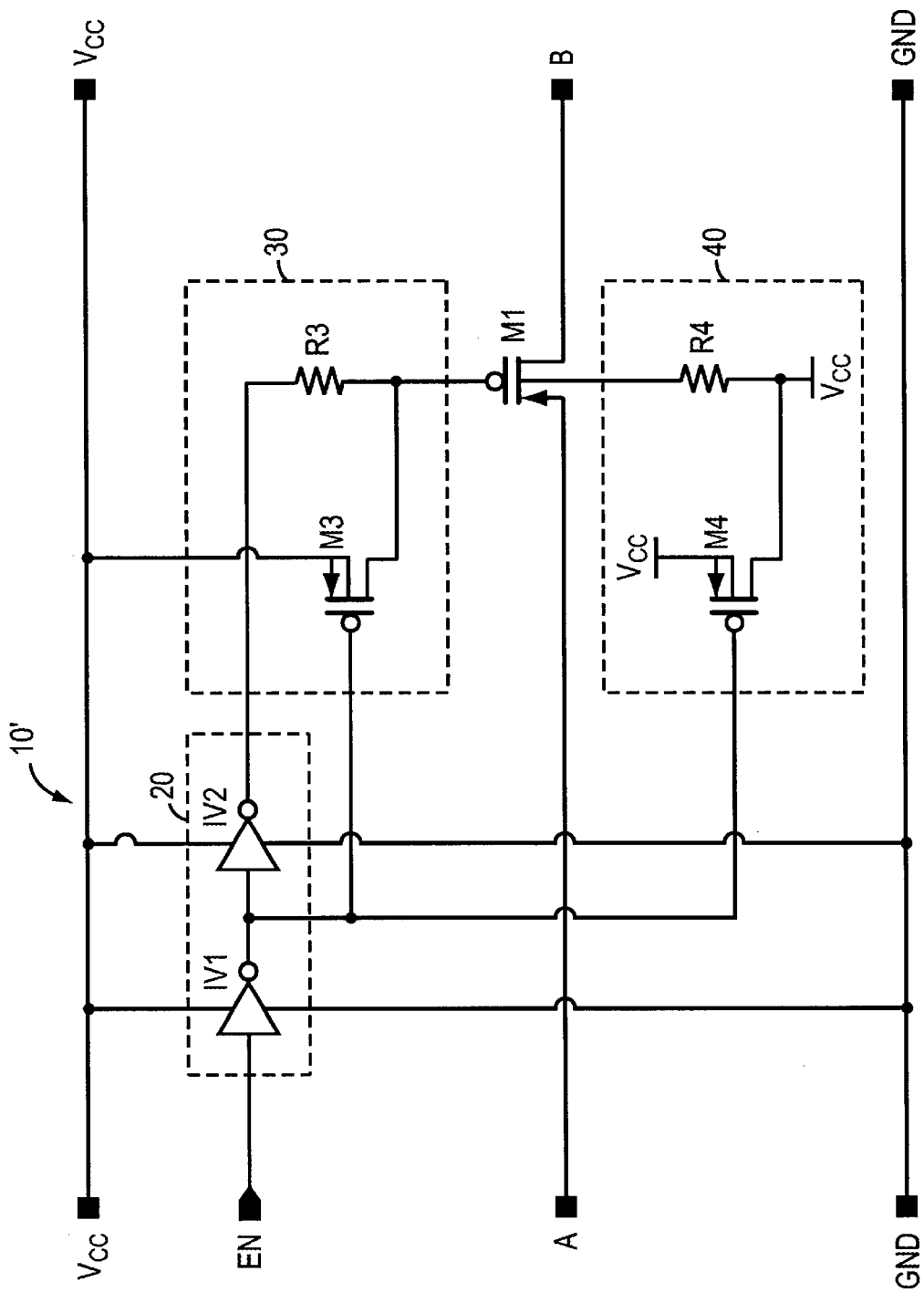
FIG. 4 is a simplified circuit diagram of a first embodiment of the high-frequency switch circuit of FIG. 2, showing the impedance elements as resistive elements with control shunts.

FIG. 4 illustrates one preferred embodiment of the PMOS-based high-frequency switch circuit shown in FIG. 2. Circuit 10' includes inverter stage 20, first impedance element 30, second impedance element 40, and pass gate transistor M1. Impedance element 30 includes resistor R3 having a high-potential node coupled to the output of IV2 and a low-potential node coupled to the gate of M1. Element 30 further includes PMOS shunting control transistor M3 having its gate coupled to the output of inverter IV1, its source coupled to Vcc, and its drain also coupled to the gate of M1. Impedance element 40 includes resistor R4 having a high-potential node coupled to Vcc and a low-potential node coupled to the bulk of M1. Element 40 further includes PMOS shunting control transistor M4 having its gate coupled to the output of inverter IV1, its source coupled to Vcc, and its drain coupled to the bulk of M1. Resistors R3 and R4 preferably have a resistance of about one kilohm each.

In operation, the circuit 10' of FIG. 4 provides relatively high impedance pathways at the gate and the bulk of M1 that did not previously exist. The illustrated configuration effects a significant change in the frequency response of the circuit 10' in comparison to that established by the prior-art circuit of FIG. 1. Specifically, when a logic LOW is applied to EN, a logic HIGH is applied to the gates of transistors M3 and M4 by the output of IV1, thereby turning off those transistors and fixing the signal pathway to the gate and the bulk of M1. The LOW at EN results in a coupling of the gate and the bulk of M1 to GND through resistor R3 and to Vcc through resistor R4, respectively so that that pass gate transistor is on. The resistances R3 and R4 are preferably established to ensure that the difference in the potentials of the gate and the bulk are sufficient to keep M1 on to allow a signal to be propagated between nodes A and B without also developing a shunting parasitic impedance pathway in the transistor M1 to GND, which is the reference for the potential drop across R3 and R4.

Completing the description of the operation of the circuit 10' of FIG.4, when a logic HIGH is applied to EN, a logic LOW is applied to the gates of transistors M3 and M4 by the output of IV1, thereby turning on those transistors and fixing the signal pathway to the gate and the bulk of M1 to the potential of Vcc. The HIGH at EN results in a coupling of the gate and bulk of M1 to Vcc through transistors M3 and M4, respectively so that that pass gate transistor is off. With transistors M3 and M4 on, transistor M1 will remain off, as that is the pathway with the lower impedance.

Figure 5:
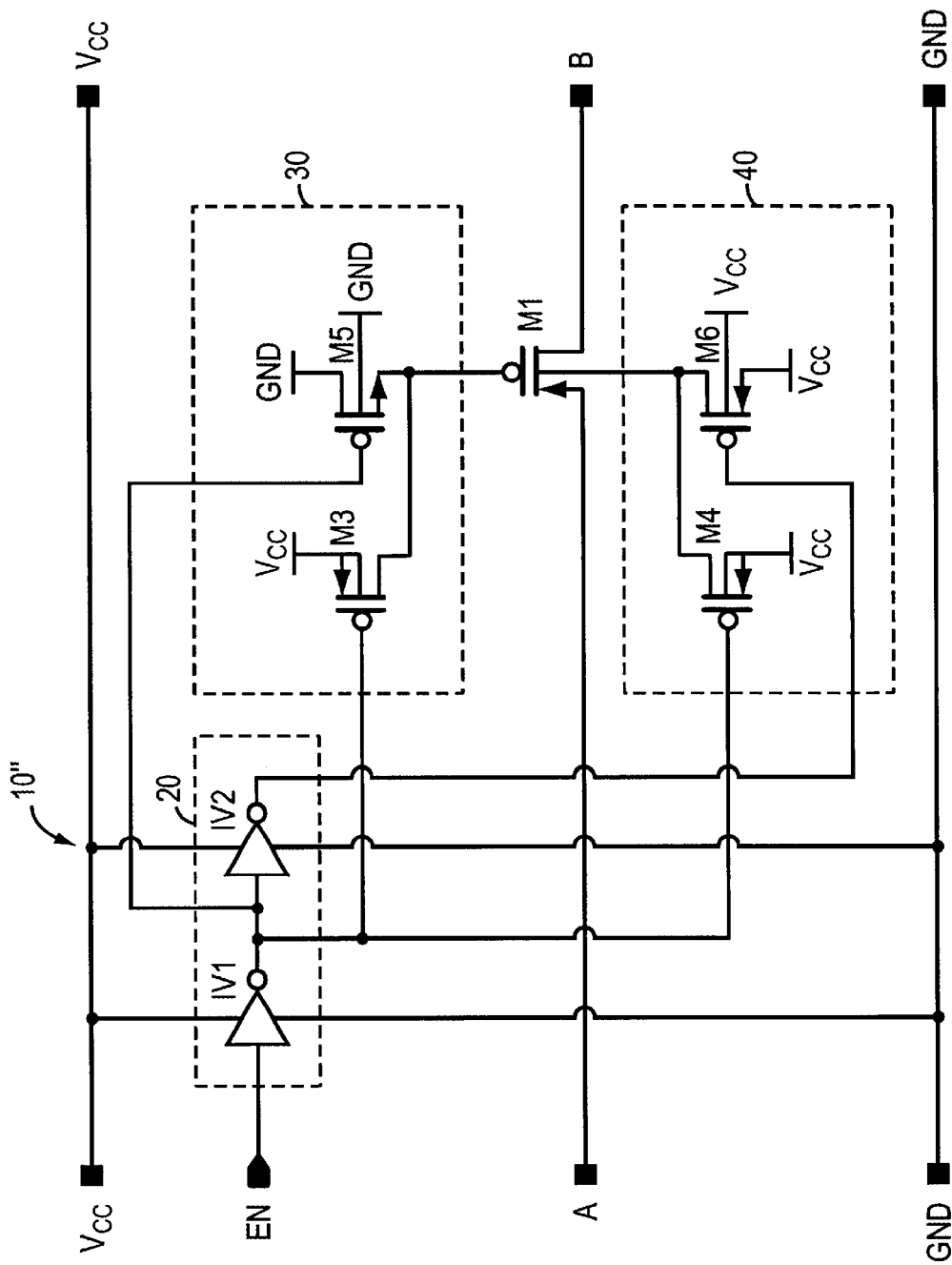
FIG. 5 is a simplified circuit diagram of a second embodiment of the high-frequency switch circuit of FIG. 2, showing the impedance elements as diode-wired MOS structures with control shunts.

A second preferred embodiment of the high-frequency switch circuit of the present invention shown in FIG. 2 is shown as circuit 10" in FIG. 5. Circuit 10" includes inverter stage 20, first impedance element 30, second impedance element 40, and pass gate transistor M1, as previously shown. Impedance element 30 includes PMOS shunting control transistor M3 coupled in the manner previously described with respect to circuit 10' of FIG. 4, as well as transistor M5. NMOS transistor M5 includes a gate coupled to the output of inverter IV1, a source coupled to the gate of M1, and a drain and a bulk coupled to GND. Impedance element 40 includes PMOS shunting control transistor M4 coupled in the manner previously described with respect to circuit 10' of FIG. 4, as well as transistor M6. PMOS transistor M6 includes a gate coupled to the output of inverter IV2, a drain coupled to the bulk of M1, and a source and bulk coupled to Vcc.

In operation, the circuit 10" of FIG. 5 provides relatively high impedance pathways at the gate and the bulk of M1 that did not previously exist. The illustrated configuration effects a significant change in the frequency response of the circuit 10" in comparison to that established by the prior-art circuit of FIG. 1. Specifically, when a logic LOW is applied to EN, a logic HIGH is applied to the gates of transistors M3, M4, and M5 by the output of IV1, thereby turning off transistors M3 and M4 and turning on transistor M5. The LOW at EN results in a coupling of the gate of M1 to GND through transistors M5. Additionally, the LOW at the output of inverter IV2 turns on transistor M6 so that the bulk of M1 is coupled to Vcc, ensuring that pass gate transistor M1 is on. The capacitances associated with transistors M5 and M6 provide sufficient impedance to ensure that the difference in the potentials of the gate and the bulk are sufficient to keep M1 on to allow a signal to be propagated between nodes A and B without also developing a shunting parasitic impedance pathway.

Completing the description of the operation of the circuit 10" of FIG. 5, when a logic HIGH is applied to EN, a logic LOW is applied to the gates of transistors M3, M4, and M5 by the output of IV1, thereby turning on transistors M3 and M4 and turning off transistor M5. The HIGH at EN results in a coupling of the gate of M1 to Vcc through transistor M3 so that that pass gate transistor is off. Additionally, the HIGH at the output of inverter IV2 turns off transistor M6 so that the bulk of M1 is coupled to Vcc, ensuring that pass gate transistor M1 is off. With transistors M3 and M4 on, transistor M1 will remain off, as that is the pathway with the lower impedance.

Figure 6:
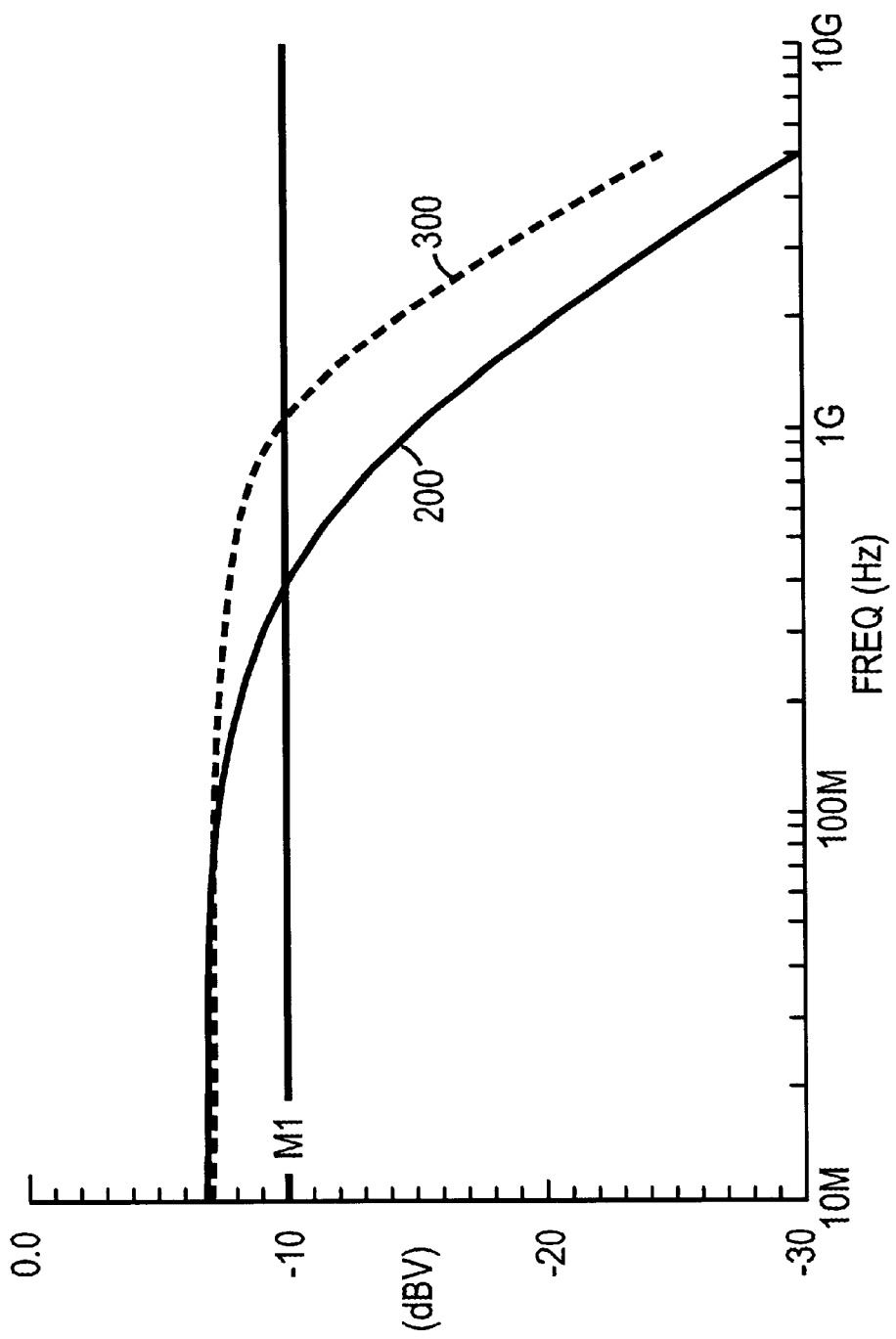
FIG. 6 is a Bode plot showing the frequency response of the high-frequency switch circuit of the present invention in comparison to the frequency response of the prior-art transfer circuit of FIG. 1.

The advantage associated with the introduction of the impedance elements 30 and 40 of FIG. 2 can clearly be seen with respect to the waveforms shown in FIG. 6. FIG. 6 is a Bode diagram showing the logarithmic drop-off in signal potential propagated through a pass gate circuit with respect to frequency changes. Waveform 200 represents the frequency response associated with the prior-art switch circuit of FIG. 1, while waveform 300 represents the frequency response associated with the high-frequency switch circuit 10" of FIG. 5. The figure shows the −3 dB drop-off level. This drop-off level is a commonly used figure of merit used to describe the usable passband of a system. For the prior-art circuit represented by waveform 200, the associated −3 dB frequency is about 350 MHz. For the switch circuit 10" of the present invention, the −3 dB frequency is slightly more than about 900 MHz, an improvement of approximately more than 2.5 times. It can be seen that the switch circuit of the present invention may be employed as a conventional pass gate device having a pass through frequency bandwidth substantially greater than that available with prior MOS-based pass gate devices. It allows the gate and bulk potentials of transistor M1 to change with the input signal at A or B rather than being coupled via a low-impedance path to Vcc or GND. It is to be understood that the switch circuit 10 may be suitable for use at frequencies exceeding 900 MHz, including well above 1 GHz, and is not intended to be limited to the representative example result presented in FIG. 6

Figure 7:
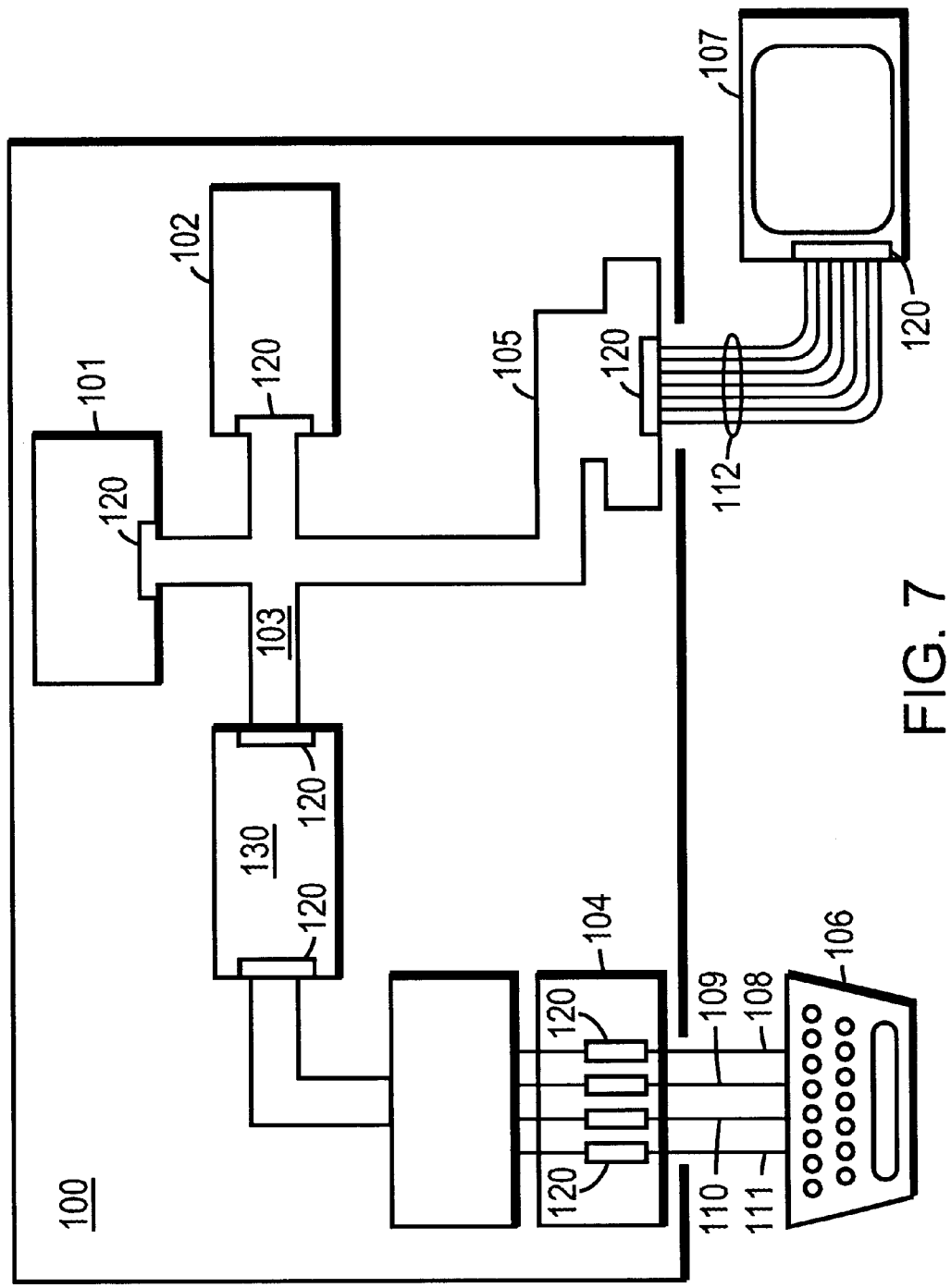
FIG. 7 is a simplified block representation of the switch circuit of the present invention forming part of a computer system, including as part of a bus and as part of a backplane.

As previously noted, the switch circuit 10 of the present invention may be employed in a variety of systems, as it is an effective mechanism for signal propagation in many applications including, but not limited to, internal and external data transmission, as well as video signal transmission. As illustrated in FIG. 7, a computing system 100 including central processing unit 130, a first memory cell 101, a second memory cell 102, an internal bus 103, a first input/output port 104, and a second input/output port 105, interfaces with external devices, such as a keyboard 106 and a display 107. Each of the devices identified may include a bus switch circuit 10 for each signal transmission line illustrated by way of example by lines 108–112 linking devices together for signal transmission. It is to be understood that those lines may represent wire, optical cable, and wireless connections. Box 120 is a simplified representation of one or more of the switch circuit 10 of the present invention employed for such signal transmission.

Figure 8:
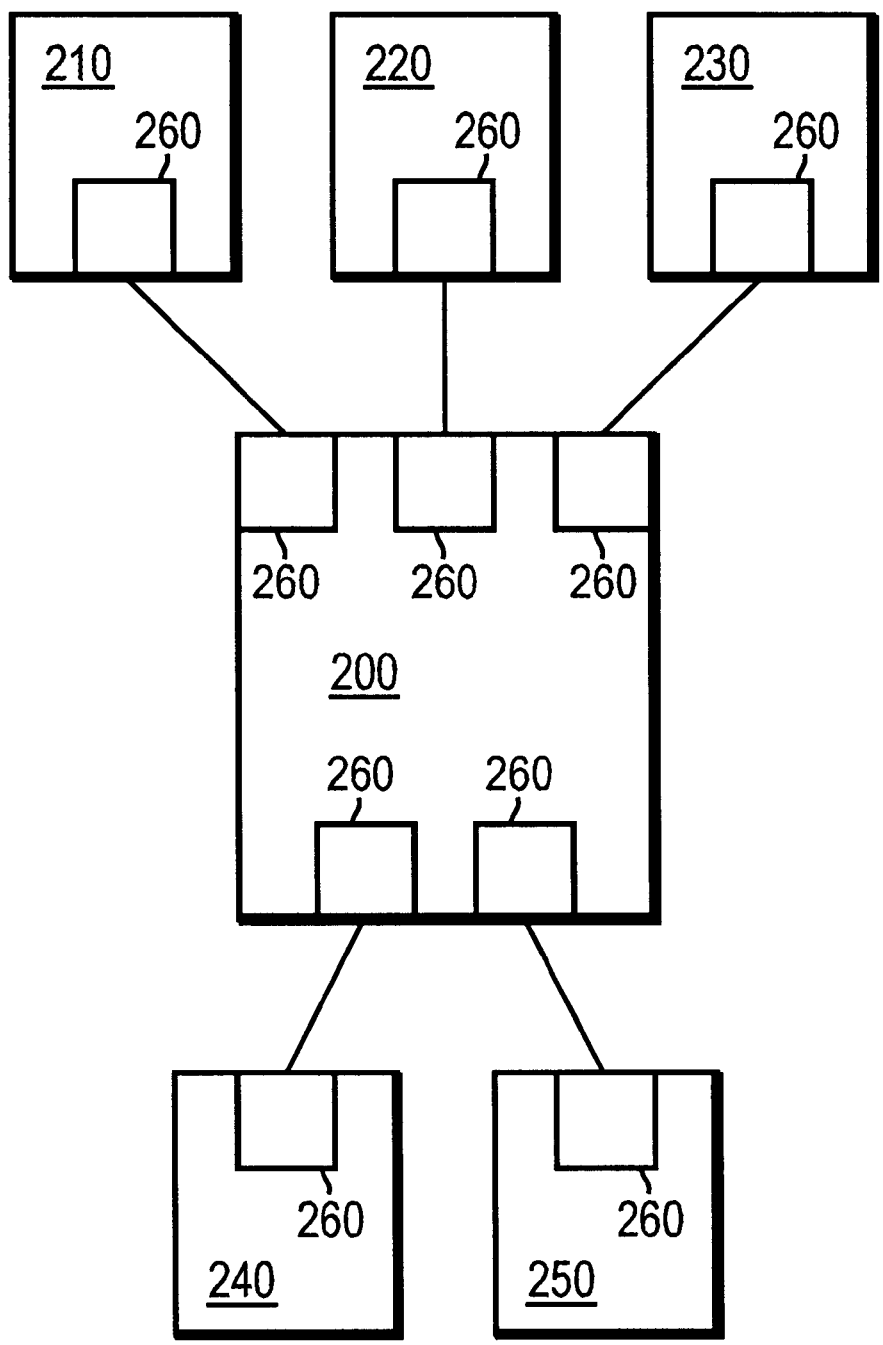
FIG. 8 is a simplified block representation of the switch circuit of the present invention forming part of a router.

FIG. 8 provides a simplified representation of a signal router 200 designed to analyze and direct signal traffic among a plurality of network systems 210–250 that represent either individual computing systems or networks of computing systems. The rate at which signal transmission occurs, and the quality of that signal, is dependent upon the switching circuitry employed. The router 200 may employ the switch circuit 10 of the present invention for each signal line of the interface system that connects the router 200 to the network systems 210–250. Box 260 is a simplified representation of one or more of the switch circuit 10 of the present invention employed for such signal transmission. It may be employed by the router 200 as well as by any one or more of the network systems 210–250.

Figure 9:
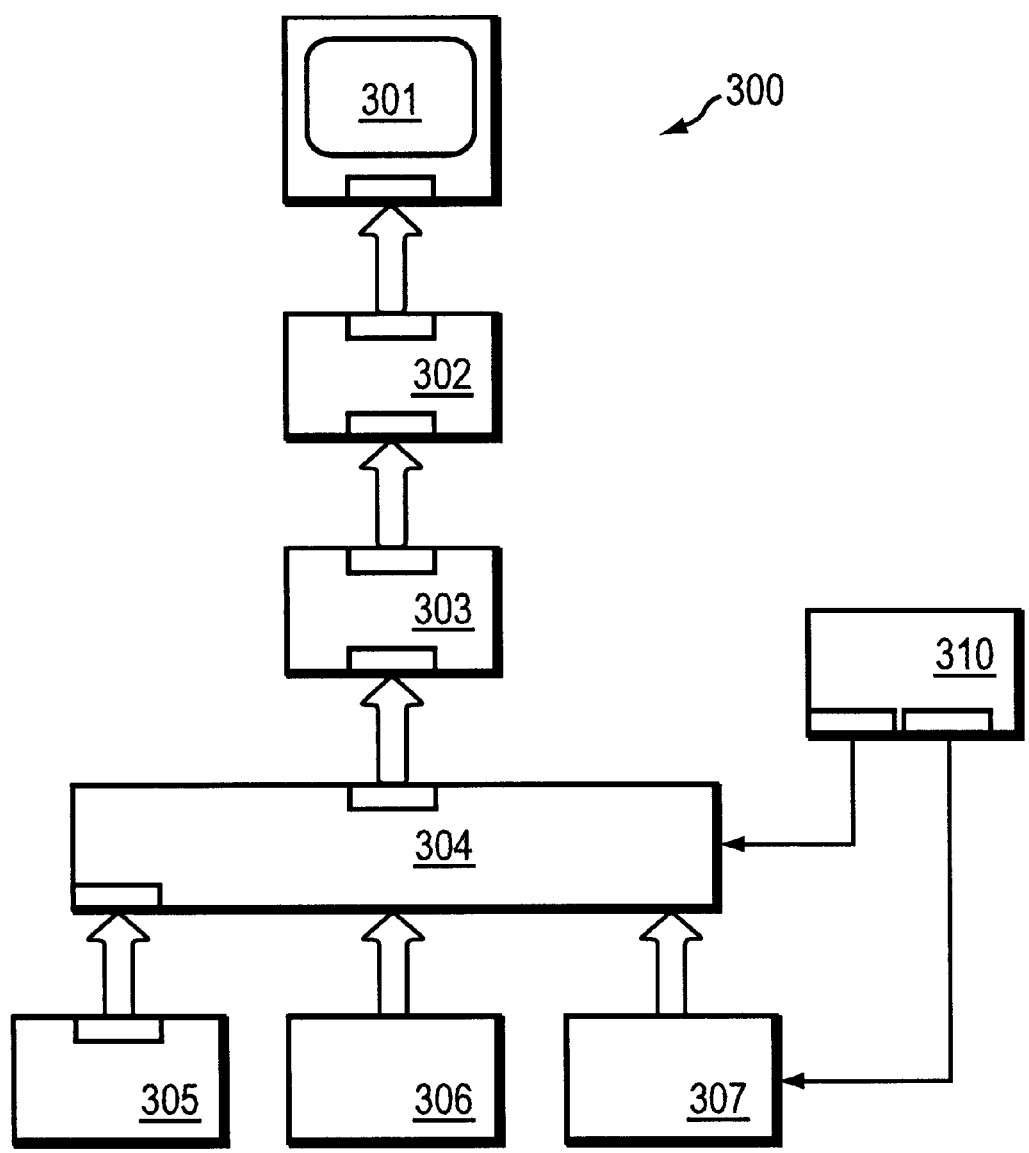
FIG. 9 is a simplified block representation of the switch circuit of the present invention forming part of a flat-panel screen display system.

FIG. 9 provides a simplified representation of a flat panel display system 300 including a flat panel display 301, a panel interface 302 that may employ LVDS technology, for example, an image scaler 303, a frame rate converter 304, a digital interface device 305 that may employ TMDS technology, for example, an analog interface device 306, and a video decoder 307. All may be coupled to a computer system 310 for data exchange and processing. The switch circuit 10 of the present invention is particularly suitable for the transmission of high-frequency digital signal transmissions, such as video signal transmissions. It may be employed in any one or more of the components of the flat panel display system 300 and in the computing system 310. Box 320 is a simplified representation of one or more of the switch circuit 10 of the present invention employed for such signal transmission.

While the present invention has been described with specific reference to particular embodiments, it is to be understood that all modifications, variants, and equivalents are deemed to be within the scope of the following appended claims.

What is claimed is:

1. A high frequency switch circuit for allowing or preventing the transfer of an electrical signal between a first node and a second node, wherein the electrical signal is transferred from the first node to the second node or from the second node to the first node when the switch circuit allows the transfer, and wherein the electrical signal is not transferred when the switch circuit prevents the transfer, wherein the high-frequency switch circuit is powered by a high-potential supply rail and a low-potential supply rail, the switch circuit comprising:

an enable signal node for receiving a switch circuit activation signal, the switch circuit activation signal defines an ON condition and an OFF condition of a MOS transfer transistor, the MOS transfer transistor having a source coupled to the first node and a drain coupled to the second node, a first impedance element coupled between the high and the low potential supply rails and a gate of said MOS transfer transistor, wherein the first impedance element, responsive to the ON and OFF conditions, defines two states, where one state is a low impedance and the second state a high impedance, wherein said first impedance element is constructed to substantially negate low-parasitic shunt capacitance associated with said MOS transfer transistor, and.

a second impedance element coupled between the high and the low potential supply rails and a bulk of said MOS transfer transistor, wherein the second impedance element, responsive to the ON and OFF conditions, defines two states, where one state is a low impedance and the second state a high impedance, wherein said second impedance element is constructed to substantially negate low-parasitic shunt capacitance associated with said MOS transfer transistor.

2. The switch circuit as claimed in claim 1 wherein said MOS transfer transistor is a PMOS transistor and said second impedance element is coupled between said bulk of said MOS transfer transistor and the high-potential supply rail.

3. The switch circuit as claimed in claim 1 wherein said MOS transfer transistor is an NMOS transistor and said second impedance element is coupled between said bulk of said MOS transfer transistor and the low-potential supply rail.

4. The switch circuit as claimed in claim 1 further comprising an inverter stage formed of one or more inverters coupled between said enable signal node and said first and second impedance elements.

5. The switch circuit as claimed in claim 4 wherein said second impedance element includes an impedance PMOS transistor having a gate coupled to an output of said inverter stage, a source and a bulk coupled to the high-potential supply rail, and a drain coupled to said bulk of said PMOS transfer transistor.

6. The switch circuit as claimed in claim 4 wherein said first and second impedance elements include a resistor having a high-potential node coupled to an output of said inverter stage and a low-potential node coupled to said gate of said PMOS transfer transistor.

7. The switch circuit as claimed in claim 6 wherein said resistor of said impedance elements has a resistance of one kilo ohm or greater.

8. The switch circuit as claimed in claim 6 wherein said inverter stage includes a first inverter coupled in series with a second inverter each having an input and an output, wherein said enable signal node is coupled to said input of said first inverter and said output of said second inverter is coupled to said high-potential node of said resistor, said impedance element further comprising an impedance PMOS transistor having a gate coupled to said output of said first inverter, a source coupled to the high-potential supply rail, and a drain coupled to said gate of said PMOS transfer transistor.

9. The switch circuit as claimed in claim 4 wherein the second impedance element includes a second resistor having a high-potential node coupled to the high-potential supply rail and a low-potential node coupled to said bulk of said PMOS transfer transistor.

10. The switch circuit as claimed in claim 9 wherein said second resistor of said second impedance element has a resistance of one kilohm or greater.

11. The switch circuit as claimed in claim 9 wherein said inverter stage includes a first inverter coupled in series with a second inverter each having an input and an output, wherein said enable signal node is coupled to said input of said first inverter and said output of said second inverter is coupled to said high-potential node of said resistor of said impedance element, said second impedance element further comprising a PMOS transistor having a gate coupled to said output of said first inverter, a source coupled to the high-potential supply rail, and a drain coupled to said bulk of said PMOS transfer transistor.

12. The switch circuit as claimed in claim 4, wherein the said first impedance element includes an impedance NMOS transistor having a gate coupled to an output of said inverter stage, a drain coupled to said gate of said PMOS transfer transistor, and a source and a bulk coupled to the low-potential supply rail.

13. The switch circuit as claimed in claim 12 wherein said inverter stage includes a first inverter coupled in series with a second inverter each having an input and an output, wherein said enable signal node is coupled to said input of said first inverter and said output of said first inverter is coupled to said gate of said impedance NMOS transistor, said impedance element further comprising an impedance PMOS transistor having a gate coupled to said output of said first inverter, a source coupled to the high-potential supply rail, and a drain coupled to said gate of said PMOS transfer transistor.

14. The switch circuit as claimed in claim 5 herein said inverter stage includes a first inverter coupled in series with a second inverter each having an input and an output, wherein said enable signal node is coupled to said input of said first inverter and said output of said second inverter is coupled to said gate of said impedance PMOS transistor of said second impedance element, said second impedance element further comprising a second impedance PMOS transistor having a gate coupled to said output of said first inverter, a source coupled to the high-potential supply rail, and a drain coupled to said bulk of said PMOS transfer transistor.

15. A high frequency switch circuit for allowing or preventing the transfer of an electrical signal between a first node and a second node, wherein the electrical signal is transferred from the first node to the second node or from the second node to the first node when the switch circuit defines an ON condition, and wherein the electrical signal is not transferred when the switch circuit defines an OFF condition, wherein the high-frequency switch circuit is powered by a high-potential supply rail and a low-potential supply rail, the switch circuit comprising:

a MOS transfer transistor having a source coupled to the first node and a drain Coupled to the second node, a first impedance element coupled between the high and the low potential supply rails and a gate of said MOS transfer transistor, wherein the first impedance element, responsive to the ON and OFF conditions, defines two states, where one state is a low impedance and the second state a high impedance, wherein said first impedance element serves to decouple said gate from either of the supply rails by substantially negating low-parasitic shunt capacitance associated with said MOS transfer transistor, and a second impedance element coupled between the high and the low potential supply rails and a bulk of said MOS transfer transistor, wherein the second impedance element responsive to the ON and OFF conditions, defines two states, where one state is a low impedance and the second state a high impedance, wherein said second impedance element serves to decouple said bulk from either of the supply rails by substantially negating low-parasitic shunt capacitance associated with said MOS transfer transistor.

16. A computing system including switch circuits to allow or prevent the transfer of an electrical signal between a first signal transmission node and a second signal transmission node, wherein the electrical signal is transferred from the first node to the second node or from the second node to the first thereby defining an ON condition and defining an OFF condition when not transferred, wherein the switch circuit may be powered by a high-potential supply rail and a low potential supply rail, the computer system comprising:
- a MOS transfer transistor having a source coupled to the first node and a drain coupled to the second node,
- a first impedance element coupled between the high and the low potential supply rails and a gate of said MOS transfer transistor, wherein the first impedance element, responsive to the ON and OFF conditions, defines two states, where one state is a low impedance and the second state a light impedance, wherein said first impedance element serves to decouple said gate from either of the supply rails by substantially negating low-parasilic shunt capacitance associated with said MOS transfer transistor, and
- a second impedance element coupled between the high and the low potential supply rails and a bulk of said MOS transfer transistor, wherein the second impedance element, responsive to the ON and Off conditions, defines two states, where one state is a low impedance and the second state a high impedance, wherein said second impedance element serves to decouple said bulk from either of the supply rails by substantially negating low-parasitic shunt capacitance associated with said MOS transfer transistor.

17. The computer system as claimed in claim 16, wherein the MOS transfer transistor is an NMOS transistor and said second impedance element is coupled between said bulk of said MOS transfer transistor and the low-potential supply rail.

18. The computer system as claimed in claim 16 wherein the MOS transfer transistor is an PMOS transistor and said second impedance element is coupled between said bulk of said MOS transfer transistor and the high-potential supply rail.

19. A router Including switch circuits to allow or prevent the transfer of an electrical signal between a first signal transmission node and a second signal transmission node, wherein the electrical signal is transferred from the first node to the second node or from the second node to the first thereby defining an ON condition and defining an OFF condition when not transferred, wherein the switch circuit may be powered by a high-potential supply rail and a low potential supply rail, the router comprising
- a MOS transfer transistor having a source coupled to the first node and a drain coupled to the second node,
- a first impedance element coupled between the high and the low potential supply rails and a gate of said MOS transfer transistor, wherein the first impedance clement, responsive to the ON and OFF conditions, defines two states, where one state is a low impedance and the second state a high impedance wherein said first impedance element serves to decouple said gate from either of the supply rails by substantially negating low-parasitic shunt capacitance associated with said MOS tansfer transistor, and
- a second impedance element coupled between the high and the low potential supply rails and a bulk of said MOS transfer transistor, wherein the second impedance clement, responsive to the ON and OFF conditions, defines two states, where one state is a low impedance and the second state a high impedance, wherein said second impedance clement serves to decouple said bulk from either of the supply rails by substantially negating low-parasitic shunt capacitance associated with said MOS transfer transistor.

20. The router as claimed in claim 19 wherein the MOS transfer transfer transistor is an NMOS transistor and said second impedance element is coupled between said bulk of said MOS transfer transistor and the low-potential supply rail.

21. The router as claimed in claim 19 wherein the MOS transfer transistor is an PMOS transistor and said second impedance element is coupled between said bulk of said MOS transfer transistor and the high-potential supply rail.

22. A flat panel screen system including switch circuits to allow or prevent the transfer of an electrical signal between a first signal transmission node and a second signal transmission node, wherein the electrical signal is transferred from the first node to the second node or from the second node to the first thereby defining an ON condition and defining an OFF condition when not transferred, wherein the switch circuit is powered by a high-potential supply rail and a low potential supply rail, the flat panel screen system comprising:
- a MOS transfer transistor having a source coupled to the first node and a drain coupled to the second node,
- a first impedance element coupled between the high and the low potential supply rails and a gate of said MOS transfer transistor, wherein the first impedance element, responsive to the ON and OFF conditions, defines two states, where one state is a low impedance and the second state a high impedance, wherein said first impedance clement serves to decouple said gate from either of the supply rails by substantially negating low-parasitic shunt capacitance associated with said MOS transfer transistor, and
- a second impedance element coupled between the high and the low potential supply rails and a bulk of said MOS transfer transistor, wherein the second impedance element, responsive to the ON and OFF conditions, defines two states, where one state is a low impedance and the second state a high impedance, wherein said second impedance element serves to decouple said bulk from either of the supply rails by substantially negating low-parasitic shunt capacitance associated with said MOS transfer transistor.

23. The computer system as claimed in claim 22 wherein the MOS transfer transistor is an NMOS transistor and said second impedance element is coupled between said bulk of said MOS transfer transistor and the low-potential supply rail.

24. The computer system as claimed in claim 22 wherein the MOS transfer transistor is an PMOS transistor and said second impedance element is coupled between said bulk of said MOS transfer transistor and the high-potential supply rail.

25. A process for allowing or preventing the transfer of an electrical signal between a first signal transmission node and a second signal transmission node, wherein the electrical signal is transferred from the first node to the second or from the second node to the first, when allowed, the process comprising the steps of:
- coupling a MOS transfer transistor between the first node and the second node, said MOS transfer transistor having a gate and a bulk, and
- establishing a first impedance pathway configured to negate substantially low-parasitic shunt capacitance associated with said MOS transfer transistor and connecting said first impedance pathway to said gate of said MOS transfer transistor, and establishing a second impedance pathway con figured to negate substantially low-parasitic shunt capacitance associated with said MOS transfer transistor and connecting said second impedance pathway to said bulk of said MOS transfer transistor.

26. The process as claimed in claim 25 wherein said MOS transfer transistor is an NMOS and said second impedance is coupled between said bulk of said MOS transfer transistor and a low-potential supply rail.

27. The process as claimed in claim 25 wherein said MOS transfer transistor is an PMOS and said second impedance is coupled between said bulk of said MOS transfer transistor and a high-potential supply rail.

28. The process as claimed in claim 25 wherein said first impedance pathway and said second impedance pathway establish impedances that are sufficient to keep said MOS transfer transistor on when enabled without developing a shunting parasitic impedance pathway between said MOS transfer transistor and a power supply rail.

* * * * *